United States Patent
Wu et al.

(10) Patent No.: US 11,094,862 B2
(45) Date of Patent: Aug. 17, 2021

(54) SEMICONDUCTOR DEVICE WITH THROUGH HOLES ON BONDING PARTS AND BONDING METHOD THEREOF

(71) Applicant: Prilit Optronics, Inc., Tainan (TW)

(72) Inventors: Biing-Seng Wu, Tainan (TW); Chao-Wen Wu, Tainan (TW); Hsing-Ying Lee, Tainan (TW)

(73) Assignee: PRILIT OPTRONICS, INC., Tainan (TW)

( * ) Notice: Subject to any disclaimer, the term of this patent is extended or adjusted under 35 U.S.C. 154(b) by 24 days.

(21) Appl. No.: 16/268,123

(22) Filed: Feb. 5, 2019

(65) Prior Publication Data

US 2019/0386191 A1    Dec. 19, 2019

Related U.S. Application Data

(60) Provisional application No. 62/684,733, filed on Jun. 13, 2018.

(51) Int. Cl.
*H01L 33/62* (2010.01)
*B23K 26/362* (2014.01)
(Continued)

(52) U.S. Cl.
CPC .............. *H01L 33/62* (2013.01); *B23K 26/20* (2013.01); *B23K 26/362* (2013.01); *B23K 2101/40* (2018.08); *H01L 2933/0066* (2013.01)

(58) Field of Classification Search
CPC ............ H01L 33/62; H01L 2933/0066; B23K 26/362; B23K 26/20; B23K 2101/40
See application file for complete search history.

(56) References Cited

U.S. PATENT DOCUMENTS

| 2010/0327896 A1* | 12/2010 | Lee ..................... G01R 1/06744 |
| | | 324/756.03 |
| 2014/0021627 A1* | 1/2014 | Kimura ................... H01L 24/16 |
| | | 257/773 |

(Continued)

FOREIGN PATENT DOCUMENTS

| CN | 1912694 A | 2/2007 |
| CN | 105428508 A | 3/2016 |
| TW | 200717835 A | 2/2007 |

OTHER PUBLICATIONS

Office Action dated Jun. 19, 2020 in CN Application No. 201910285142.X.

(Continued)

*Primary Examiner* — Quoc D Hoang
(74) *Attorney, Agent, or Firm* — Muncy, Geissler, Olds & Lowe, P.C.

(57) ABSTRACT

A bonding method of a semiconductor device is disclosed. The method includes steps of forming a plurality of holes on two bonding parts of a main substrate, respectively; disposing a semiconductor device on the main substrate, and aligning the two bonding parts with two conduction parts of the semiconductor device; aligning a laser to the conduction parts and operating the laser to emit a laser beam from a lower part of the main substrate, wherein the laser beam passes through the holes of the bonding part to strike on the conduction part, so as to melt each conduction part to bond with the bonding part. With configuration of the holes, the conduction parts and the bonding part can be smoothly bonded by using laser, so as to achieve the purpose of transferring the semiconductor device.

18 Claims, 4 Drawing Sheets

(51) Int. Cl.
  *B23K 26/20* (2014.01)
  *B23K 101/40* (2006.01)

(56) References Cited

U.S. PATENT DOCUMENTS

2018/0190611 A1* 7/2018 Tatsumi .................. H01L 24/32
2018/0287098 A1* 10/2018 Hu ......................... H05B 45/00
2018/0294383 A1* 10/2018 Chen ...................... H01L 33/42

OTHER PUBLICATIONS

Office Action dated Aug. 10, 2020 in TW Application No. 108111899.

* cited by examiner

SEMICONDUCTOR DEVICE WITH THROUGH HOLES ON BONDING PARTS AND BONDING METHOD THEREOF

CROSS-REFERENCE TO RELATED APPLICATIONS

This patent application claims the benefit of U.S. Provisional Application No. 62/684,733 filed on Jun. 13, 2018, herein incorporated by reference in its entirety.

BACKGROUND OF THE INVENTION

1. Field of the Invention

The present invention relates to a bonding method of a semiconductor device, more particularly, the method uses configuration of holes and emits a laser beam to strike upon the conduction parts through the holes, so as to melt the conduction parts and the bonding parts, or to melt the buffer layer between the conduction parts and the bonding parts, thereby achieving the purpose of bonding the semiconductor device on the substrate.

2. Description of the Related Art

In recent years, the technological process of manufacturing a semiconductor device has been fully developed, but some semiconductor devices need to be bonded on the substrate. For example, an adhesive layer structure is typically used to bond the LED devices to a glass substrate; however, the quality of the adhesive layer structure affects the operation of bonding the LED, so the adhesive layer is very critical in the flow of bonding of the LED. However, during the bonding process, the adhesive layer structure is adhered to the electrode of the LED and may damage the electrode of the LED.

Therefore, what is needed is to develop a bonding method of a semiconductor device, to solve this conventional problem.

SUMMARY OF THE INVENTION

In order to solve conventional problem, the present invention provides a bonding method of a semiconductor device, configured to solve the conventional problem.

According to an embodiment, the present invention provides a bonding method of a semiconductor device. The method comprises steps of forming a plurality of holes on two bonding parts of a main substrate, respectively; disposing a semiconductor device on the main substrate, and aligning the two bonding parts with two conduction parts of the semiconductor device; and aligning a laser to the two conduction parts, respectively, and operating the laser to emit a laser beam from a lower part of the main substrate, wherein the laser beam passes through the plurality of holes of the two bonding parts to strike on the two conduction parts, respectively, so as to melt each of the two conduction parts with one of the two bonding parts corresponding thereto.

Preferably, the semiconductor device is a LED, and each of the two conduction parts is made of gold (Au).

Preferably, the main substrate is a glass substrate, and each of the two bonding parts is made of molybdenum (Mo), aluminum (Al) or an aluminum-molybdenum alloy.

Preferably, the plurality of holes is formed on the two bonding parts by laser etching manner.

Preferably, the plurality of holes is arranged periodically, and each of the plurality of holes has a circular cross section or polygonal cross section.

According to an embodiment, the present invention provides a bonding method of a semiconductor device. The method comprises steps of forming a plurality of holes on two bonding parts of a main substrate, respectively; disposing buffer layers on the two bonding parts, respectively, and placing a semiconductor device on the main substrate, and aligning the buffer layers with two conduction parts of the semiconductor device, respectively; and aligning a laser with the two conduction parts, respectively, and operating the laser to emit a laser beam from a lower part of the main substrate, wherein the laser beam passes through the plurality of holes of the bonding parts to strike on the buffer layers, respectively, so as to melt the buffer layers to form electrical contact between the two bonding parts and the two conduction parts.

Preferably, the semiconductor device is a LED, and each of the two conduction parts is made of gold (Au).

Preferably, the main substrate is a glass substrate, and each of the two bonding parts is made of molybdenum (Mo), aluminum (Al) or aluminum molybdenum alloy.

Preferably, the plurality of holes is formed on the two bonding parts by laser etching manner.

Preferably, the plurality of holes is arranged periodically, and each of the plurality of holes has a circular cross section or a polygonal cross section.

Preferably, the buffer layer is made of metal material having low melting point.

According to an embodiment, the present invention provides a semiconductor device including a main substrate, two bonding parts, two conduction parts and a semiconductor device. The two bonding parts are disposed on the main substrate and provided with a plurality of holes. The two conduction parts are disposed on the two bonding parts. The semiconductor device is disposed on the two conduction parts.

Preferably, the semiconductor device further comprises a buffer layer disposed between the two bonding parts and the two conduction parts.

Preferably, the semiconductor device is a LED, and each of the two conduction parts is made of gold (Au).

Preferably, the main substrate is a glass substrate, and each of the two bonding parts is made of molybdenum (Mo), aluminum (Al) or aluminum-molybdenum alloy.

Preferably, the plurality of holes are formed on the two bonding parts by a laser etching manner.

Preferably, the plurality of holes are arranged periodically, and each of the plurality of holes has a circular cross section or a polygonal cross section.

Preferably, the buffer layer is made of a metal material having a low melting point.

According to above contents, in the method of transferring a semiconductor device, with configuration of the holes, the laser can be used to smoothly form the electrical contact between the conduction parts and the bonding parts without damaging electrode of the semiconductor device, thereby achieving the purpose of transferring the semiconductor device.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
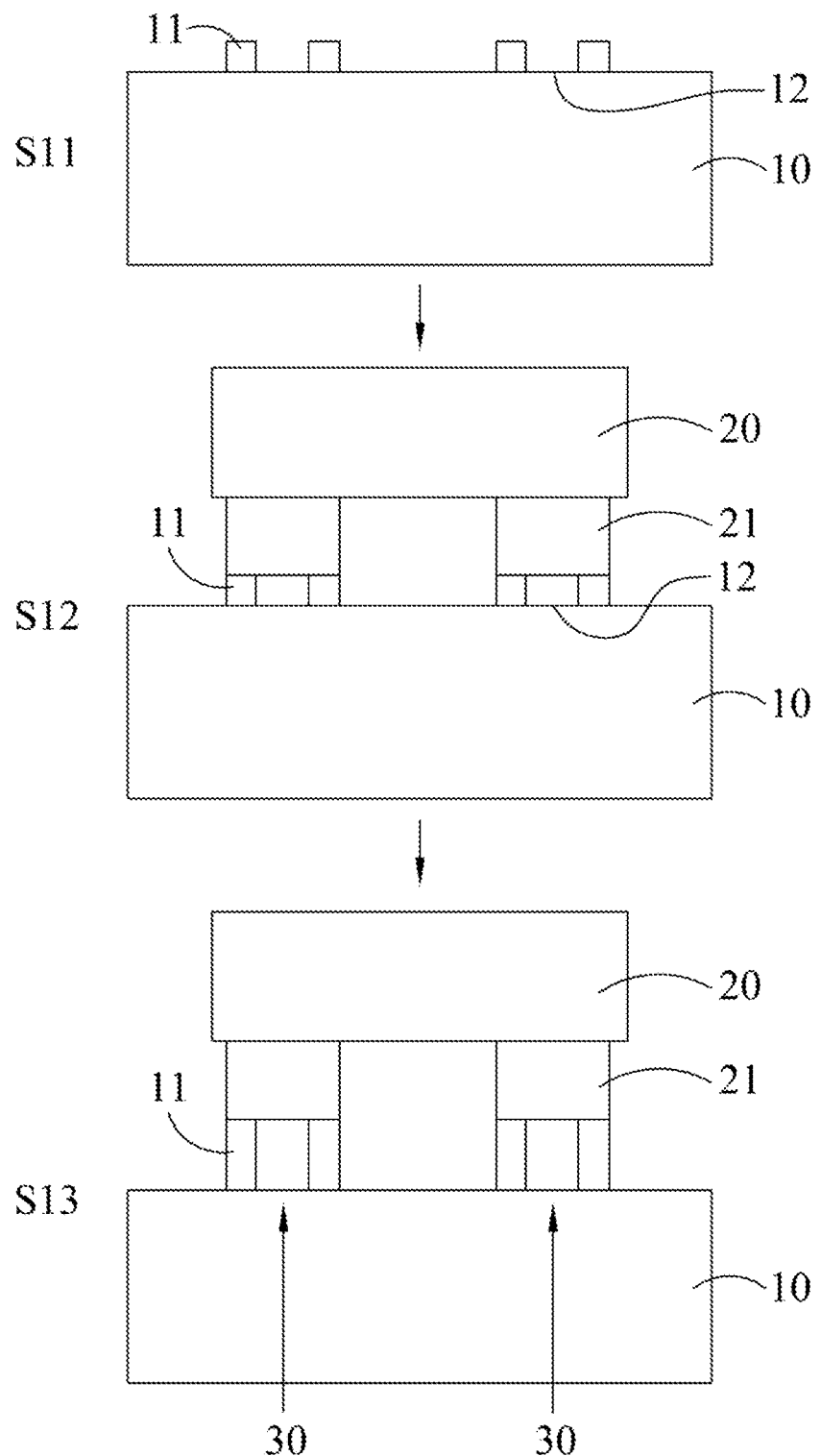
FIG. 1 illustrates a flow of the bonding method of the semiconductor device, according to a first embodiment of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Please refer to FIG. 1, which illustrates a flow of the bonding method of the semiconductor device, according to a first embodiment of the present invention. As shown in FIG. 1, the method of transferring a semiconductor device, can include steps S11 to S13. In the step S11, a plurality of holes 12 are formed on two bonding parts 11 of a main substrate 10, respectively. In an embodiment, the main substrate 10 may be a glass substrate, and each of the two bonding parts 11 can be made of molybdenum, aluminum or an aluminum-molybdenum alloy. In the step S12, a semiconductor device 20 is disposed on the main substrate 10, and the two bonding parts 11 are aligned with the two conduction parts 21 of the semiconductor device 20. In an embodiment, the semiconductor device 20 may be a LED, each of the conduction parts 21 is made of gold. In the step S13, a laser 30 is aligned to the two conduction parts 21, respectively, and the laser 30 is operated to emit a laser 30 from a lower part of the main substrate 10; and the laser 30 passes through the plurality of holes 12 of the bonding part 11 to strike on the conduction parts 21, respectively. Hence, the conduction parts 21 are melted to bond the two bonding parts 11 corresponding thereto. With this configuration of the plurality of holes 12, the conduction part 21 and the bonding part 11 are smoothly bonded by using the laser 30 without damaging the electrode of the semiconductor device 20, thereby achieving the purpose of transferring the semiconductor device 20.

Furthermore, the bonding part 11 can be etched by the laser 30 to form the plurality of holes 12. In an embodiment, the laser 30 can perform etching operation anisotropicaly, so that the shapes of the holes 12 can be complete, and widths and depths of the plurality of hole 12 can be controlled more easily; in other embodiment, the hole 12 can also be formed by using exposure development process and mask, so as to achieve the purpose of forming the holes.

Figure 2:
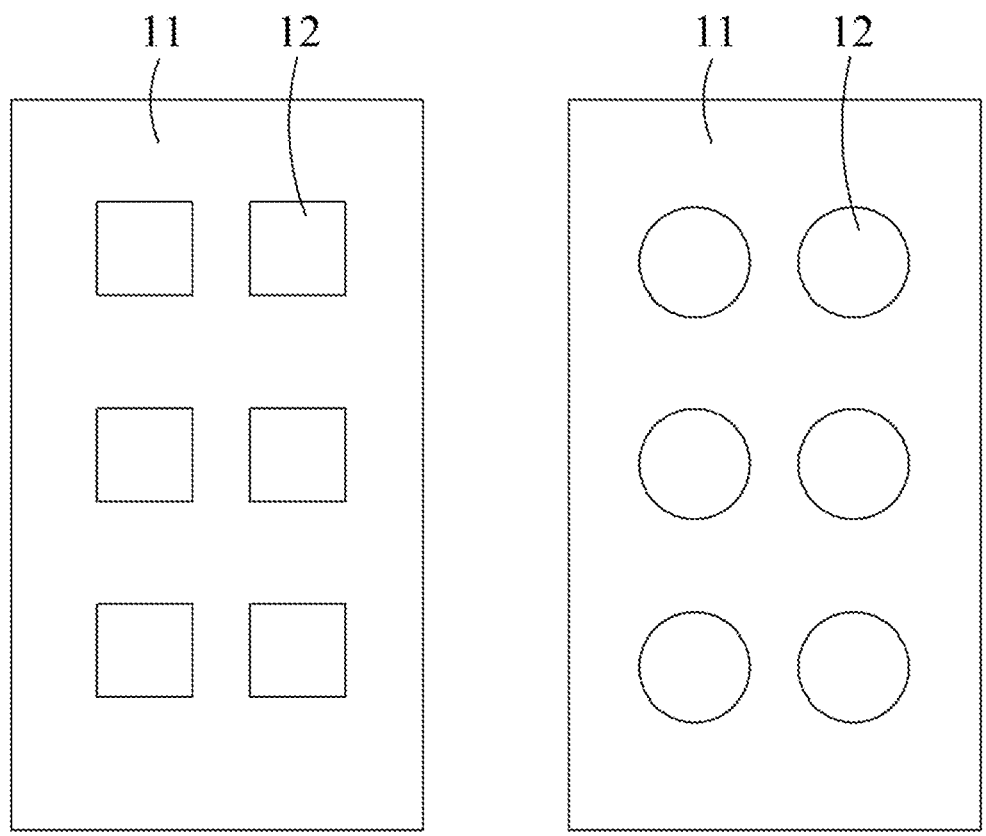
FIG. 2 shows configuration of hole used in the bonding method of the semiconductor device, according to a first embodiment of the present invention.

Please refer to FIG. 2, which shows the configuration of the holes used in the method of transferring a semiconductor device according to a first embodiment of the present invention. The plurality of holes 12 are arranged periodically, and the width of each hole 12 corresponds to a width of the laser beam, so that the laser beam can smoothly pass the hole. Each of the hole 12 has a circular cross section or polygonal cross section, for example, the polygonal shape can be a triangular shape, a quadrangular shape, a hexagonal, and so on; however, the present invention is not limited to above examples. Furthermore, the number and arrangement pattern of the plurality of holes 12 can be adjusted according to the requirements; however, the present invention is not limited to above examples.

Figure 3:
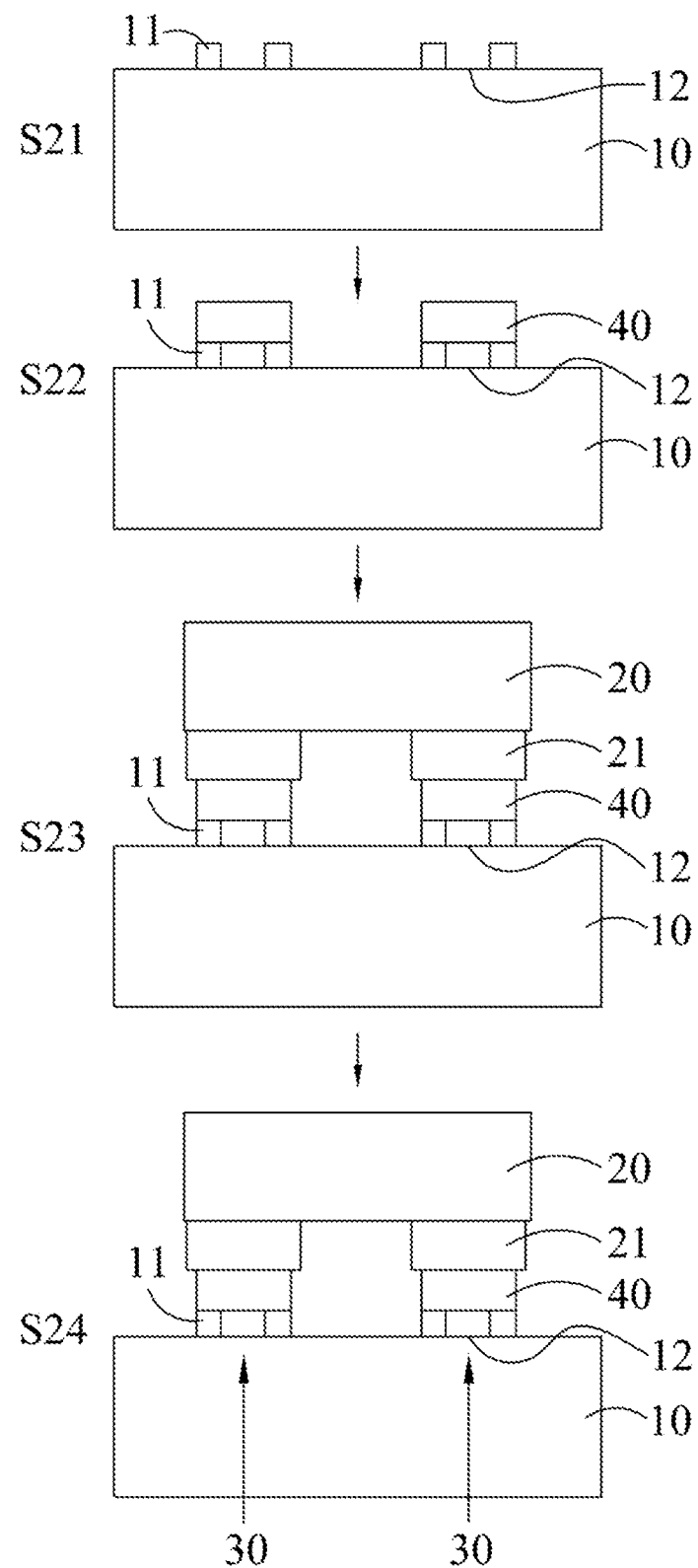
FIG. 3 illustrates a flow of the bonding method of the semiconductor device, according to a second embodiment of the present invention.

Please refer to FIG. 3, which illustrates a flow of the bonding method of the semiconductor device, according to a second embodiment of the present invention. As shown in FIG. 3, the method of transferring a semiconductor device can include steps S21 to S24. In the step S21, the plurality of holes 12 are formed on the two bonding parts 11 of the main substrate 10, respectively. In an embodiment, the main substrate 10 may be the glass substrate, and each of the two bonding parts 11 may be made of molybdenum, aluminum or aluminum molybdenum alloy. In the step S22, buffer layers 40 are disposed on the two bonding parts 11, respectively. In the step S23, a semiconductor device 20 is disposed on the main substrate 10, and the buffer layers 40 are aligned with the two conduction parts 21 of the semiconductor device 20. In an embodiment, the semiconductor device 20 can be the LED, and each of the two conduction parts 21 can be made of gold. In the step S24, the laser 30 is aligned with the conduction part 21, and the laser 30 can be operated to emit a laser 30 from a lower part of the main substrate 10, and the laser 30 passes through the holes 12 of the bonding part 11 to strike on the buffer layers 40, respectively, so that the buffer layers 40 are melted to form electrical contact between the bonding part 11 and the conduction part 21. With the configuration of the plurality of holes 12 and the buffer layers 40, the laser 30 can be used to smoothly form electrical contact between the conduction parts 21 and the bonding parts 11 without damaging electrodes of the semiconductor device 20, thereby achieving the purpose of transferring the semiconductor device 20.

Similarly, the bonding part 11 can be etched by the laser 30 to form the plurality of holes 12, so that the widths and the depths of the holes 12 can be controlled more easily. The holes 12 can be arranged periodically, and each hole 12 can have a circular cross section or a polygonal cross section, such as a quadrangular cross section or a hexagonal cross section. The number and arrangement pattern of the holes 12 can be adjusted according to requirement; however, the present invention is not limited to above examples.

It is to be noted that, the buffer layer 40 can be made of a metal material having a lower melting point than the bonding parts 11 and the conduction parts 21. Such metal material can comprise gallium (Ga), indium (In), lead (Pb), tin (Sn), cadmium (Cd), thallium (Tl), magnesium (Mg), lead bismuth alloy, gallium-based binary alloy, gallium-based multi-element alloy, indium-based alloy, bismuth-based alloy. The gallium-based alloy, indium-based alloy and bismuth-based alloy are non-toxic, stable, and have the advantages of not evaporating easily, and are preferably selected to be materials of the buffer layer 40. In an embodiment, the buffer layer 40 can be disposed by using evaporation manner or sputtering manner, or other metal growth manner; however, the present invention is not limited to above examples.

Furthermore, the semiconductor device 20 may be a transistor, a MOSFET, a thin-film transistor, or other semiconductor device; however, the present invention is not limited thereto.

Figure 4:
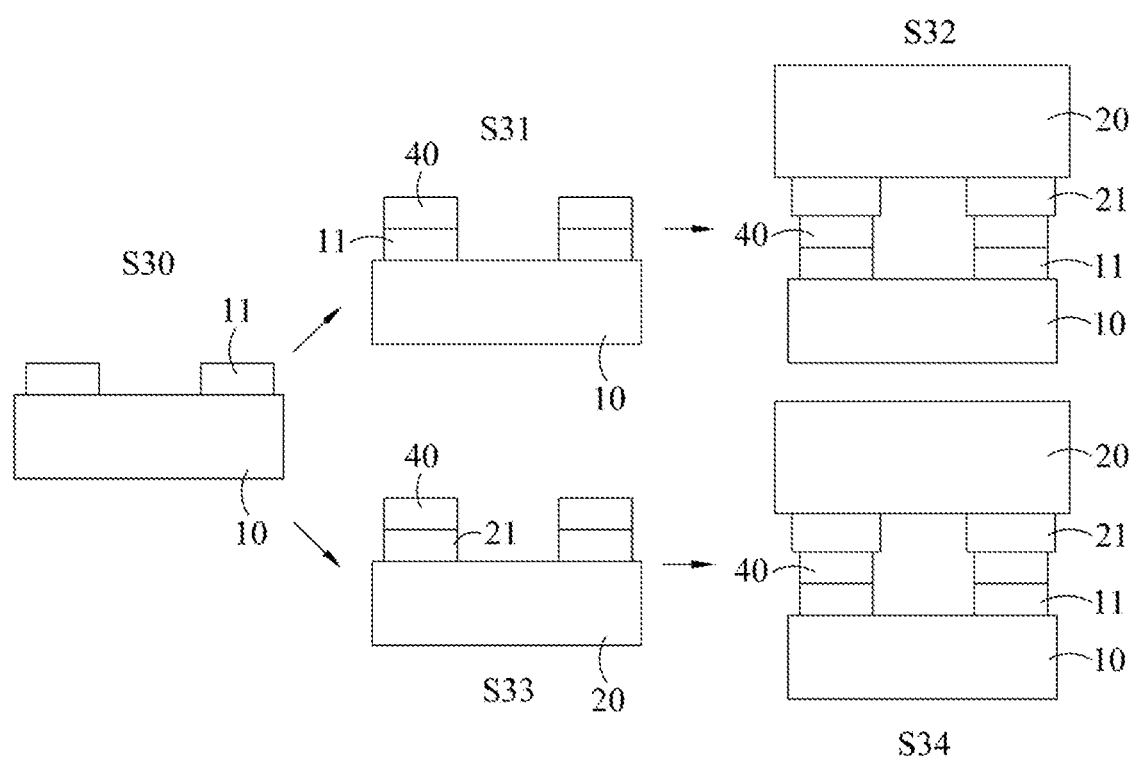
FIG. 4 illustrates a flow of the bonding method of the semiconductor device, according to a third embodiment of the present invention.

Please refer to FIG. 4, which illustrates a flow of the bonding method of the semiconductor device, according to a third embodiment of the present invention. As shown in FIG. 4, the method includes steps S30 to S34. In the step S30, the two bonding parts 11 are disposed on the main substrate 10. In the step S31, the buffer layers 40 are disposed on the two bonding parts 11, respectively. In the step S32, a semiconductor device 20 is disposed on the main substrate 10, and the buffer layers 40 are aligned with the two conduction parts 21 of the semiconductor device 20, respectively; and, the laser 30 or a heating system are used to melt the buffer layers 40, thereby forming electrical contact between the bonding part 11 and the conduction part 21. Preferably, the heating system can be a bakeware heating system or other device having the same function; however, the present invention is not limited to above examples. With configuration of the buffer layers 40, the laser 30 can be used to smoothly form electrical contact between the conduction parts 21 and the bonding parts 11. Particularly, the buffer layer 40 have been melted but the two conduction parts 21 and the two bonding parts 11 have not been melted, so as to achieve the purpose of transferring the semiconductor device 20.

In an embodiment, the method of transferring a semiconductor device can include following steps. In the step S30, the two bonding parts 11 are disposed on the main substrate 10. In the step S33, the buffer layers 40 are disposed on two conduction parts 21 of a semiconductor device 20, respectively. In the step S34, the semiconductor device 20 is flipped and disposed on the main substrate 10, and the buffer layers 40 are aligned with the two conduction parts 21 of the semiconductor device 20, and the laser 30 or the heating system can be used to melt the buffer layer 40, thereby forming electrical contact between the bonding part 11 and the conduction part 21. With configuration of the buffer layers 40 which can be disposed on the conduction parts 21 or the bonding parts 11 alternatively, the buffer layers 40 can be melted but the two conduction parts 21 and the two bonding parts 11 are not melted, so as to achieve the purpose of transferring the semiconductor device 20.

In summary, in the method of transferring a semiconductor device, with configuration of the plurality of holes 12 and the width of each hole 12 corresponding to the width of the laser 30, the laser 30 can smoothly pass the holes 12 to strike on the conduction parts 21, respectively. Hence, the conduction parts 21 can be melted to bond with the bonding part 11, thereby achieving the purpose of transferring the semiconductor device 20. In other embodiment, with configuration of the buffer layers 40, the buffer layer 40 can be directly melted but the two conduction parts 21 and the two bonding parts 11 are not melted, thereby forming an electrical contact between the conduction part 21 and the bonding part 11, to complete operation of transferring the semiconductor device. As a result, the technical solution of the present invention is able to complete the operation of transferring the semiconductor device 20 without damaging the electrode of the semiconductor device 20.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A bonding method of a semiconductor device, comprising:
   forming a plurality of through holes on two bonding parts of a main substrate, respectively, the main substrate being optically transmissive;
   disposing a semiconductor device on the main substrate, and aligning the two bonding parts with two conduction parts of the semiconductor device; and
   aligning a laser with the two conduction parts, respectively, and operating the laser to emit a laser beam from a lower part of the main substrate,
   wherein the laser beam passes through the plurality of through holes of the two bonding parts to strike upon the two conduction parts, respectively, so as to melt each of the two conduction parts with one of the two bonding parts corresponding thereto.

2. The method according to claim 1, wherein the semiconductor device is a LED, and each of the two conduction parts is made of gold (Au).

3. The method according to claim 1, wherein the main substrate is a glass substrate, and each of the two bonding parts is made of molybdenum (Mo), aluminum (Al) or aluminum molybdenum alloy.

4. The method according to claim 1, wherein the plurality of through holes are formed on the two bonding parts by laser etching manner.

5. The method according to claim 1, wherein the plurality of through holes are arranged periodically, and each of the plurality of through holes has a circular cross section or polygonal cross section.

6. A bonding method of a semiconductor device, comprising:
   forming a plurality of through holes on two bonding parts of a main substrate, respectively, the main substrate being optically transmissive;
   disposing buffer layers on the two bonding parts, respectively, and placing a semiconductor device on the main substrate, and aligning the buffer layers with two conduction parts of the semiconductor device, respectively; and aligning a laser with the two conduction parts, respectively, and operating the laser to emit a laser beam from a lower part of the main substrate,
wherein the laser beam passes through the plurality of through holes of the bonding parts to strike on the buffer layers, respectively, so as to melt the buffer layers to form an electrical contact between the two bonding parts and the two conduction parts.

7. The method according to claim 6, wherein the semiconductor device is a LED, and each of the two conduction parts is made of gold (Au).

8. The method according to claim 6, wherein the main substrate is a glass substrate, and each of the two bonding parts is made of molybdenum (Mo), aluminum (Al) or an aluminum-molybdenum alloy.

9. The method according to claim 6, wherein the plurality of though holes are formed on the two bonding parts by a laser etching manner.

10. The method according to claim 6, wherein the plurality of through holes are arranged periodically, and each of the plurality of holes has a circular cross section or a polygonal cross section.

11. The method according to claim 6, wherein the buffer layer is made of a metal material having a low melting point.

12. A semiconductor device, comprising:
a main substrate, the main substrate being optically transmissive;
two bonding parts, disposed on the main substrate and provided with a plurality of through holes; and
a semiconductor device, disposed on the main substrate, the semiconductor device having two conduction parts aligning with the two bonding parts.

13. The semiconductor device according to claim 12, further comprising a buffer layer disposed between the two bonding parts and the two conduction parts.

14. The semiconductor device according to claim 12, wherein the semiconductor device is a LED, and each of the two conduction parts is made of gold (Au).

15. The semiconductor device according to claim 12, wherein the main substrate is a glass substrate, and each of the two bonding parts is made of molybdenum (Mo), aluminum (Al) or an aluminum-molybdenum alloy.

16. The semiconductor device according to claim 12, wherein the plurality of through holes are formed on the two bonding parts by a laser etching manner.

17. The semiconductor device according to claim 12, wherein the plurality of through holes are arranged periodically, and each of the plurality of through holes has a circular cross section or a polygonal cross section.

18. The semiconductor device according to claim 13, wherein the buffer layer is made of a metal material having a low melting point.

* * * * *